United States Patent
Kim et al.

(10) Patent No.: US 9,843,296 B2
(45) Date of Patent: Dec. 12, 2017

(54) LINEARIZER AND RADIO FREQUENCY POWER AMPLIFIER USING SAME

(71) Applicant: Avago Technologies General IP (Singapore) Pte. Ltd., Singapore (SG)

(72) Inventors: Un Ha Kim, Seoul (KR); Jung Hyun Kim, Uiwang (KR); Young Kwon, Thousand Oaks, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/840,633

(22) Filed: Aug. 31, 2015

(65) Prior Publication Data

US 2017/0063310 A1    Mar. 2, 2017

(51) Int. Cl.
| | |
|---|---|
| *H03G 3/20* | (2006.01) |
| *H03F 3/04* | (2006.01) |
| *H03F 1/32* | (2006.01) |
| *H03F 3/19* | (2006.01) |
| *H03F 3/193* | (2006.01) |
| *H03F 3/24* | (2006.01) |

(52) U.S. Cl.
CPC ......... *H03F 1/3205* (2013.01); *H03F 1/3276* (2013.01); *H03F 3/19* (2013.01); *H03F 3/193* (2013.01); *H03F 3/245* (2013.01); *H03F 2200/102* (2013.01); *H03F 2200/222* (2013.01); *H03F 2200/387* (2013.01); *H03F 2200/411* (2013.01); *H03F 2200/451* (2013.01)

(58) Field of Classification Search
CPC ................ H03G 3/20; H03F 3/04; H03F 1/26
USPC ........................................ 330/149, 136, 302
See application file for complete search history.

(56) References Cited

U.S. PATENT DOCUMENTS

| | | | | |
|---|---|---|---|---|
| 6,256,482 B1* | 7/2001 | Raab | ................... | H03F 1/0227 330/199 |
| 7,831,221 B2 | 11/2010 | Leffel et al. | | |
| 7,917,106 B2* | 3/2011 | Drogi | ................... | H03F 1/0205 330/291 |
| 8,368,470 B2 | 2/2013 | Alidio et al. | | |
| 9,007,128 B2 | 4/2015 | Gupta | | |
| 2008/0068078 A1* | 3/2008 | Iwasaki | ................ | H03F 1/0261 330/124 R |

(Continued)

FOREIGN PATENT DOCUMENTS

| | | |
|---|---|---|
| WO | WO2006012306 A1 | 2/2006 |
| WO | WO2011025598 A1 | 3/2011 |
| WO | WO2012050257 A2 | 4/2012 |

OTHER PUBLICATIONS

Kim, "A Study on MB Reconfigurable Linear CMOS PA for Mobile Applications", 2015.

(Continued)

*Primary Examiner* — Patricia T Nguyen

(57) ABSTRACT

A linearizer comprises a delay compensation circuit, an envelope reshaping circuit and a phase shift unit. The delay compensation circuit is configured to delay an input signal and to output a delayed input signal to a power amplifier. The envelope reshaping circuit is configured to detect an envelope of the input signal and to generate a reshaped envelope signal. The phase shift unit configured to provide an envelope reshaped capacitance based on the reshaped envelope signal to the delayed input signal to reshape the delayed input signal.

20 Claims, 10 Drawing Sheets

(56) References Cited

U.S. PATENT DOCUMENTS

| | | | | |
|---|---|---|---|---|
| 2009/0302945 A1* | 12/2009 | Catoiu | ............... | H03F 1/3229 |
| | | | | 330/252 |
| 2013/0200949 A1* | 8/2013 | Wilson | ................ | H03G 3/004 |
| | | | | 330/127 |
| 2013/0241655 A1 | 9/2013 | Liss et al. | | |
| 2013/0285740 A1* | 10/2013 | Cummins | ............ | H03F 1/0222 |
| | | | | 330/2 |
| 2014/0111279 A1* | 4/2014 | Brobston | ............. | H03F 1/0222 |
| | | | | 330/286 |
| 2015/0214908 A1 | 7/2015 | Kim et al. | | |

OTHER PUBLICATIONS

Sahu, et al., "A High Efficiency, Linear RF Power Amplifier With a Power-Tracking, Dynamically Adaptive Buck-Boost Supply", Submission for IEEE Transactions on Microwave Theory and Techniques, May 20, 2014.

Tang, et al., "Compact, tunable large group delay line," IEEE 10th Annual Conference on Wireless and Microwave Technology, pp. 1-3, Apr. 2009.

Kim, et al., "A high-efficiency SOI CMOS stacked-FET power amplifier using phase-based linearization," IEEE Microwave and Wireless Components Letters, Sep. 19, 2014.

\* cited by examiner

LINEARIZER AND RADIO FREQUENCY POWER AMPLIFIER USING SAME

BACKGROUND

In carrying out power amplification, a power amplifier normally utilizes nonlinear elements such as transistors, diodes, and other nonlinear semiconductor devices. As a result, a nonlinear distortion may occur in an output signal of the power amplifier. For instance, as the magnitude of an input signal increases, the ratio between the magnitude of the output signal and that of the input signal, i.e., a gain of the power amplifier, may become irregular. This phenomenon is known as amplitude modulation-amplitude modulation distortion (hereinafter referred to as AM-AM distortion). Similarly, as the magnitude of an input signal increases, a phase shift of the output signal may also occur. This phenomenon is known as amplitude modulation-phase modulation distortion (hereinafter referred to as AM-PM distortion). Such distortions may deteriorate the reliability of the output signal, and the efficiency of the power amplifier.

In order to compensate for the AM-PM distortion and the AM-AM distortion, various linearization schemes have been used, but with limited success as the effect of linearization tends to decrease as the bandwidth of a signal increases.

Accordingly, there has existed a need for a power amplifier capable of preventing nonlinear distortion over a wide range of bandwidth.

BRIEF DESCRIPTION OF THE DRAWINGS

The representative embodiments provided herein may be best understood when read with the accompanying drawings. It should be noted that various features depicted therein are not necessarily drawn to scale, for the sake of clarity and discussion. Wherever applicable and practical, like reference numerals refer to like elements.

DETAILED DESCRIPTION

In the following detailed description, for purposes of explanation but not limitation, representative embodiments disclosing specific details are set forth in order to facilitate a better understanding of the present teachings. However, it will be apparent to one having ordinary skill in the art having had the benefit of the present disclosure that other embodiments in accordance with the present teachings that depart from the specific details disclosed herein may still remain within the scope of the appended claims. Moreover, descriptions of well-known apparatuses and methods may be omitted so as not to obscure the description of the representative embodiments.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a," "an" and "the" include both singular and plural referents, unless the context clearly dictates otherwise. Thus, for example, "a device" may include a single or plural devices.

Although the terms "first," "second," etc. may be used herein to describe various elements, these elements should not be limited by these terms. These terms are used to distinguish one element from another. For example, a first element could be termed a second element, and, similarly, a second element could be termed a first element, without departing from the scope of the present teachings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
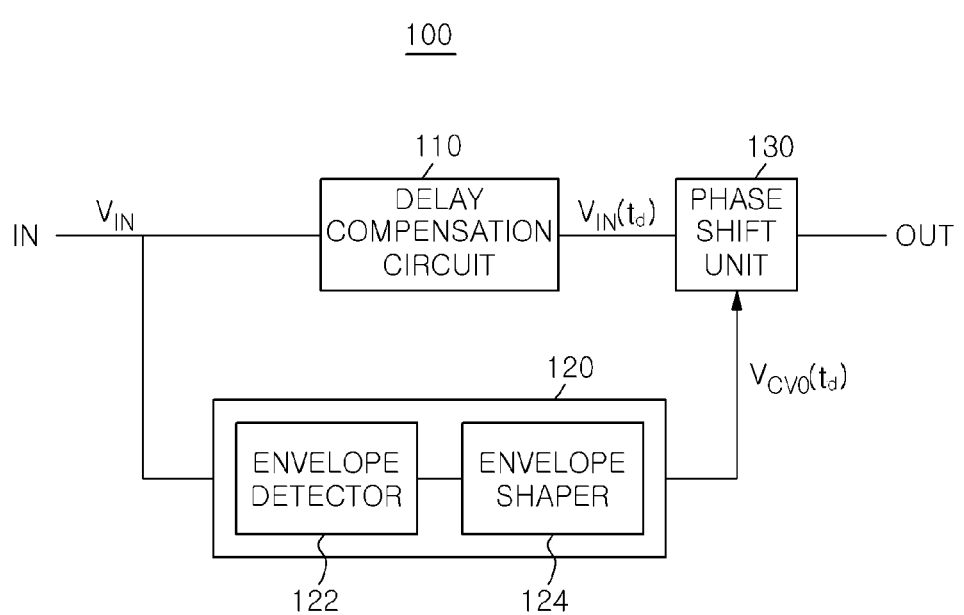
FIG. 1 illustrates a configuration of a linearizer in accordance with a representative embodiment.

FIG. 1 illustrates a configuration of a linearizer according to a representative embodiment. The linearizer 100 is an apparatus configured to improve a non-linear behavior of a power amplifier and minimize a distortion of a signal. Further, a communication apparatus, e.g., a mobile device, may use integrated circuitry comprising the linearizer 100. The integrated circuitry may further comprise a controller, a memory, etc. The linearizer may be referred to as a linearizing stage.

Generally, the controller can be implemented in numerous ways (e.g., such as with dedicated hardware) to perform various functions discussed herein. A "processor" is one example of a controller, which employs one or more microprocessors that may be programmed using software (e.g., microcode) to perform various functions discussed herein. A processor, in particular, may be constructed of any combination of hardware, firmware or software architectures, and may include memory (e.g., volatile and/or nonvolatile memory) for storing executable software/firmware executable code that allows it to perform the various functions. The controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, microcontrollers, application specific integrated circuits (ASICs), and field-programmable gate arrays (FPGAs).

In various implementations, the controller may be associated with one or more storage media (generically referred to herein as "memory," e.g., volatile and non-volatile computer memory such as random-access memory (RAM), read-only memory (ROM), programmable read-only memory (PROM), electrically programmable read-only memory (EPROM), electrically erasable and programmable read only memory (EEPROM), universal serial bus (USB) drive, floppy disks, compact disks, optical disks, magnetic tape, etc.). In some implementations, the storage media may be encoded with one or more programs that, when executed on the controller, perform at least some of the functions discussed herein. Various storage media may be fixed within the controller or may be transportable, such that the one or more programs stored thereon can be loaded into a processor or controller so as to implement various aspects of the present teachings discussed herein. The terms "program" or "computer program" are used herein in a generic sense to refer to any type of computer code (e.g., software or microcode) that can be employed to program the controller.

Referring to FIG. 1, a linearizer 100 comprises a delay compensation circuit 110, an envelope reshaping circuit 120, and a phase shift unit 130. The envelope reshaping circuit 120 comprises an envelope detector 122, and an envelope shaper 124. The envelope detector 122 and the envelope shaper 124 are connected in series. For example, an output terminal of the envelope detector 122 may be connected to an input terminal of the envelope shaper 124. The same signal may be inputted to the delay compensation circuit 110 and the envelope reshaping circuit 120. For example, an input terminal IN of the delay compensation circuit 110 may be connected to an input terminal of the envelope detector 122. An output of the delay compensation circuit 110 may be inputted to the phase shift unit 130. An output terminal of the linearizer 100 may be connected to an input terminal of an amplifier (not illustrated). The amplifier may be referred to as an amplifying stage.

A radio frequency signal inputted to an input terminal of the linearizer 100 is input to the envelope reshaping circuit 120. The envelope reshaping circuit 120 generates an analog voltage ($V_{CV0}(t_d)$; envelope reshaping signal) to control a capacitance of a voltage controlled capacitor (varactor) in the phase shift unit 130. The phase shift unit 130 provides an envelope-reshaped shunt capacitance $C_V$ based on the analog voltage $V_{CV0}(t_d)$. Using the envelope-reshaped shunt capacitance $C_V$, a signal inputted to the amplifier may be pre-distorted.

Thus, it is possible to achieve the linearization of the entire circuit through pre-distortion in an opposite direction of the AM-AM distortion and the AM-PM distortion of the power amplifier connected to the output terminal of the linearizer 100.

The signal inputted to the input terminal of the linearizer 100 is inputted to the input terminal of the delay compensation circuit 110. The delay compensation circuit 110 outputs a signal $V_{IN}(t_d)$ delayed by a time taken for the envelope reshaping circuit 120 to generate the envelope reshaping signal $V_{CV0}(t_d)$. For example, the certain time may be a few to several tens of nanoseconds.

Figure 2:
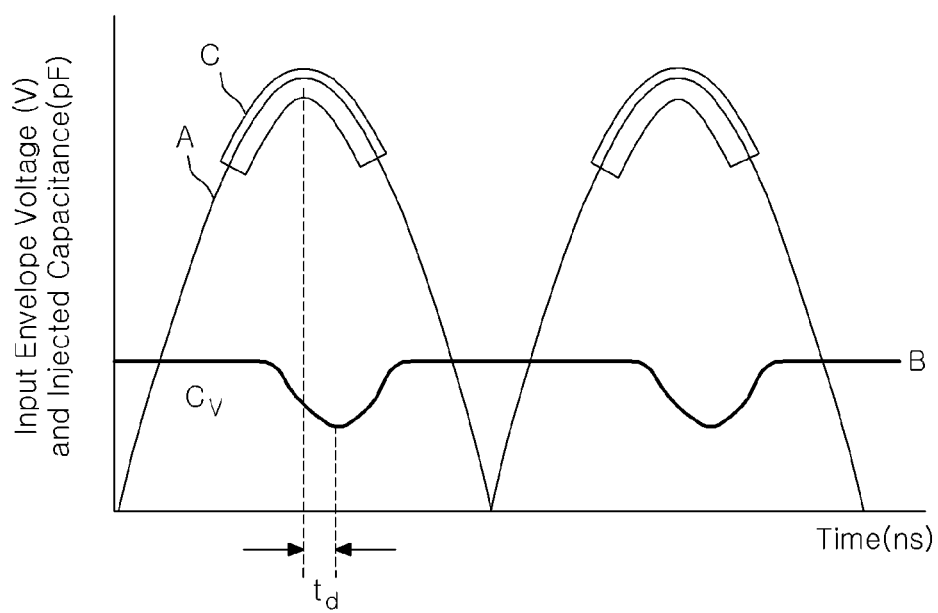
FIG. 2 is a diagram illustrating a timing mismatch between an input signal $V_{IN}$ and a capacitance $C_V$.

FIG. 2 is a diagram illustrating a time delay that occurs when the delay compensation circuit is not used.

Referring to FIG. 2, there is a timing mismatch $t_d$ between an envelope-reshaped shunt capacitance $C_V$ and an envelope A of an output signal output from the output terminal of the linearizer 100. This is because a time delay occurs due to the envelope reshaping circuit 120. When the time delay occurs, a signal phase difference is generated between the input signal and the envelope-reshaped shunt capacitance $C_V$, and increases as a bandwidth of the signal increases. Accordingly, it is more difficult to obtain a linearized amplified signal as the bandwidth of the signal increases. The timing mismatch between the input signal $V_{IN}$ and the envelope reshaping signal $V_{CV0}(t_d)$ due to the time delay increases as the bandwidth of the signal increases, thereby degrading the effect of linearization. Therefore, in 3rd/4th generation and next generation mobile communication technologies, including LTE, the linearization may be more difficult as the bandwidth of the signal increases.

In a radio frequency signal with an envelope inputted to the power amplifier, since AM-AM and AM-PM compression occurs in a high envelope area (an area C in FIG. 2) and nonlinear distortion occurs, an envelope reshaped capacitance $C_V$ with no timing mismatch is required to be injected into such an area to pre-distort the input signal.

Figure 3:
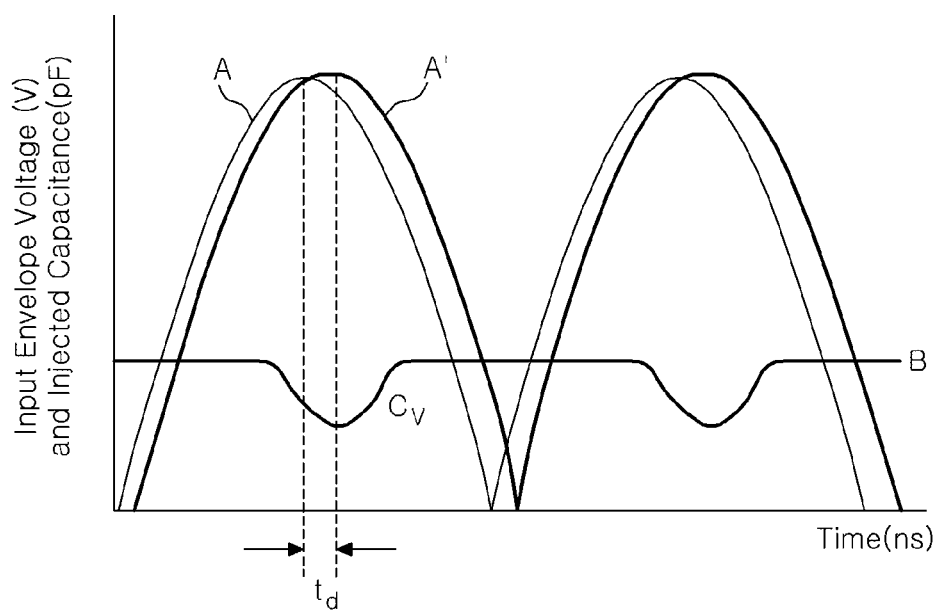
FIG. 3 is a diagram illustrating a compensated time delay in accordance with a representative embodiment.

FIG. 3 is a diagram illustrating a timing match between the input signal $V_{IN}$ and an envelope-reshaped shunt capacitance $C_V$ in accordance with a representative embodiment.

Referring to FIG. 3, there is no timing mismatch ($t_d$) between an envelope A' obtained by delaying the signal inputted to the linearizer 100 using the delay compensation circuit 110 of the linearizer 100 in accordance with a representative embodiment and the envelope-reshaped shunt capacitance $C_V$. That is, it is possible to compensate for the time delay caused by the envelope reshaping circuit 120 by delaying the signal inputted to the linearizer 100 a certain time using the delay compensation circuit 110. For example, the delay compensation circuit 110 delays the signal inputted to the amplifier connected to the output terminal of the linearizer 100, the envelope reshaping circuit 120 detects the envelope of the input signal inputted to the input terminal of the linearizer 100 to generate the envelope reshaping signal, and the phase shift unit 130 injects the capacitance $C_V$ based on the envelope reshaping signal $V_{CV0}(t_d)$ generated by the envelope reshaping circuit 120, such that the signal delayed by the delay compensation circuit 110 is reshaped.

Figure 4:
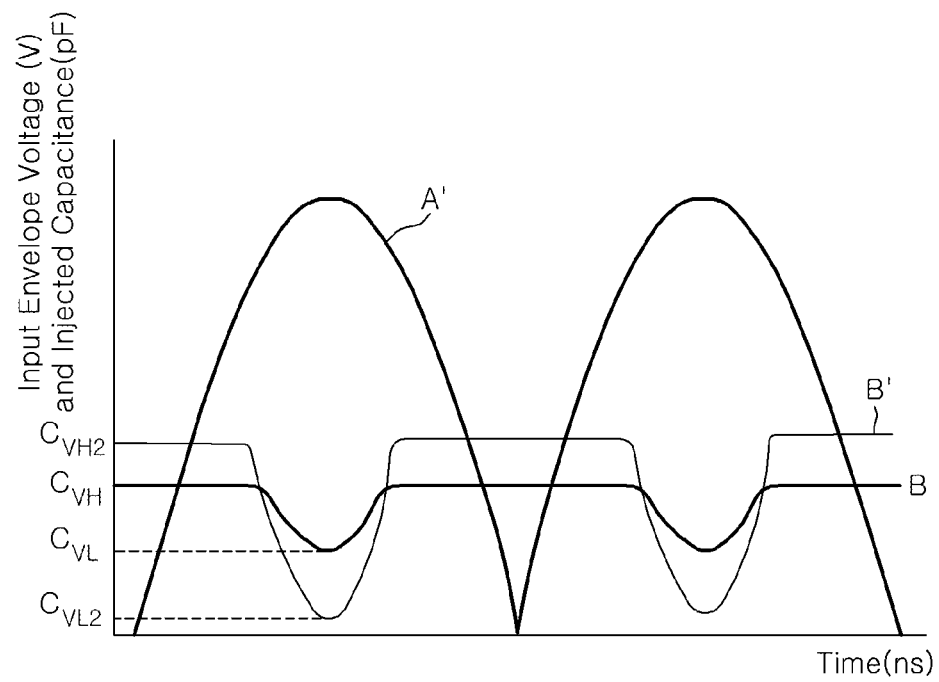
FIG. 4 is a diagram illustrating a compensated time delay and an improved shunt capacitance in accordance with a representative embodiment.

FIG. 4 is a diagram of the compensated time delay and the improved shunt capacitance $C_V$ in accordance with a representative embodiment.

Referring to FIG. 4, by increasing a ratio of a maximum value and a minimum value of the envelope-reshaped shunt capacitance $C_V$, it is possible to further compensate for the AM-AM distortion and the AM-PM distortion of the amplifier connected to the output terminal of the linearizer 100 without using a separate amplitude injection circuit.

Figure 5:
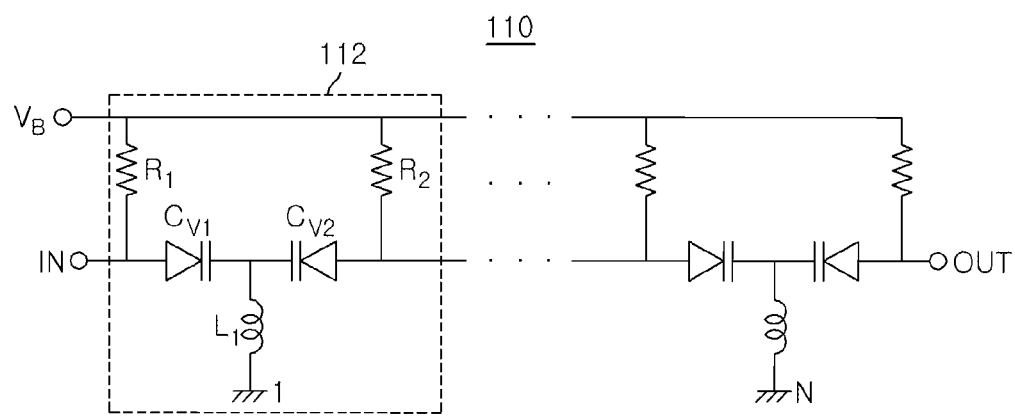
FIG. 5 is a circuit diagram of a delay compensation circuit in accordance with a representative embodiment.

FIG. 5 is a circuit diagram of a delay compensation circuit according to a representative embodiment.

A delay compensation circuit 110 may comprise one or more unit cells 112. For example, the delay compensation circuit 110 may comprise an array of two or more unit cells 112. A delay time of the signal may be adjusted by adjusting the number of unit cells 112. For example, suppose that the time delay of four nanoseconds is required and one unit cell 112 delays one nanosecond, four unit cells 112 may be used in order to delay four nanoseconds.

One unit cell 112 may comprise a first resistor $R_1$, a second resistor $R_2$, a first varactor $C_{V1}$, a second varactor $C_{V2}$, and an inductor $L_1$. Values of the first resistor $R_1$ and the second resistor $R_2$ may be the same as or different from each other. Capacitance of the varactor may be controlled by applying a bias voltage $V_B$ to the unit cell 112. For example, by adjusting the bias voltage $V_B$, the delay time may be adjusted. The values of the first resistor $R_1$ and the second resistor $R_2$ may be a few to several tens of kilo ohms. The values of the resistors may be different between the unit cells 112. The values of the first varactor $C_{V1}$ and the second varactor $C_{V2}$ may be the same as or different from each other. A cathode of the first varactor $C_{V1}$ is connected to the cathode of the second varactor $C_{V2}$. One terminal of the inductor $L_1$ is connected between the cathode of the first varactor $C_{V1}$ and the cathode of the second varactor $C_{V2}$, and the other terminal of the inductor $L_1$ is grounded. The cathodes of the first varactor $C_{V1}$ and the cathode of the second varactor $C_{V2}$ are DC-grounded via the inductor $L_1$. One terminal of the first resistor $R_1$ is connected to an anode of the first varactor $C_{V1}$. The anode of the first varactor $C_{V1}$ may be biased by the first resistor $R_1$. One terminal of the second resistor $R_2$ is connected to an anode of the second varactor $C_{V2}$. The anode of the second varactor $C_{V2}$ may be biased by the second resistor $R_2$. The other terminal of the first resistor $R_1$ may be connected to the other terminal of the second resistor $R_2$.

Figure 6:
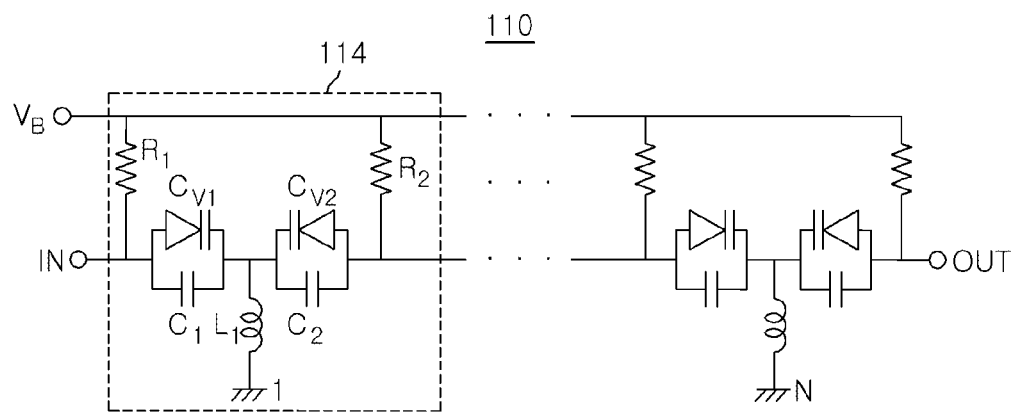
FIG. 6 is a circuit diagram of a delay compensation circuit in accordance with embodiment.

FIG. 6 is a circuit diagram of a delay compensation circuit in accordance with another embodiment.

A unit cell 114 of a delay compensation circuit 110 illustrated in FIG. 6 is the same as the unit cell 112 illustrated in FIG. 5 except that a first capacitor $C_1$ is connected in parallel to a first varactor $C_{V1}$ and a second capacitor $C_2$ is connected in parallel to a second varactor $C_{V2}$. When the fixed capacitors $C_1$ and $C_2$ are connected in parallel to the varactors $C_{V1}$ and $C_{V2}$, respectively, a tuning range of a serial capacitance may be reduced and nonlinearity and tuning sensitivity resulting from the use of the varactor may be reduced.

Figure 7:
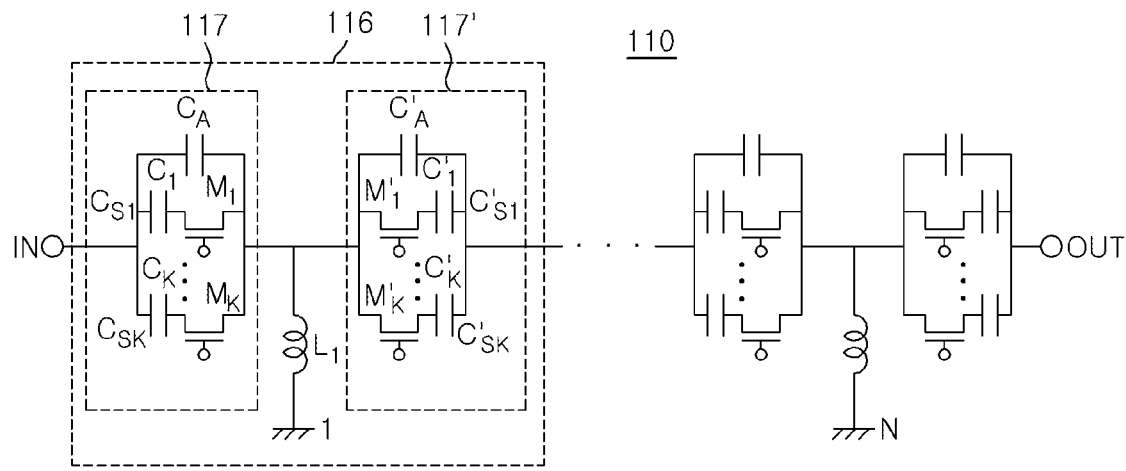
FIG. 7 is a circuit diagram of a delay compensation circuit in accordance with embodiment.

FIG. 7 is a circuit diagram of the delay compensation circuit in accordance with another embodiment.

A delay compensation circuit 110 may comprise one or more unit cells 116. For example, the delay compensation circuit 110 may comprise an array of two or more unit cells 116. One unit cell 116 may comprise a first capacitor unit 117, a second capacitor unit 117', and one inductor L1. One terminal of the first capacitor unit 117 may be connected to one terminal of the second capacitor 117'. One terminal of the inductor $L_1$ is connected between the first capacitor unit 117 and the second capacitor unit 117', and the other terminal of the inductor $L_1$ is grounded. The first capacitor unit 117 may comprise a capacitor $C_A$ and one or more switched capacitors $C_{S1}, C_{S2}, \ldots, C_{SK}$. The capacitor $C_A$ and the switched capacitors $C_{S1}, C_{S2}, \ldots, C_{SK}$ are connected in parallel. For example, the first switched capacitor $C_{S1}$ has a structure in which a first capacitor $C_1$ and a first switch $M_1$ are connected in series. The switches $M_1, M_2, \ldots, M_K$ of the respective switched capacitors $C_{S1}, C_{S2}, \ldots, C_{SK}$ may be driven independently. ON/OFF combinations of the switches of the first and second capacitor units have total $2^K$ combinations. Capacitance of the switched capacitor is changed according to ON/OFF of the switch (control voltage connected to a gate of the switch is not separately illustrated), and thus, a delay time of the circuit may be finely adjusted in a digital manner. For example, one unit cell 116 may be designed in order to delay 1 nanosecond. However, the one unit cell 116 may delay 0.9 nanoseconds instead of 1 nanosecond in practice due to various reasons, e.g., a margin of error in a manufacturing process, etc. In such case, it is not cost effective to manufacture another unit cell in order to compensate for the 0.1 nanosecond gap. Instead, with a certain combination of ONs and OFFs of the switches $M_1, M_2, \ldots, M_K$, the gap between the theoretical delay time and the practical one, i.e., 0.1 nanosecond mentioned above, can be removed. The ONs and OFFs of the switches $M_1$, $M_2, \ldots, M_K$ may be performed by a controller (not illustrated). The controller may be a main processor for controlling a device comprising the linearizer 100. Further, since the varactor is not used unlike the embodiment of FIGS. 5 and 6, it is possible to prevent nonlinear effect that may occur in the delay compensation circuit 110.

Figure 8:
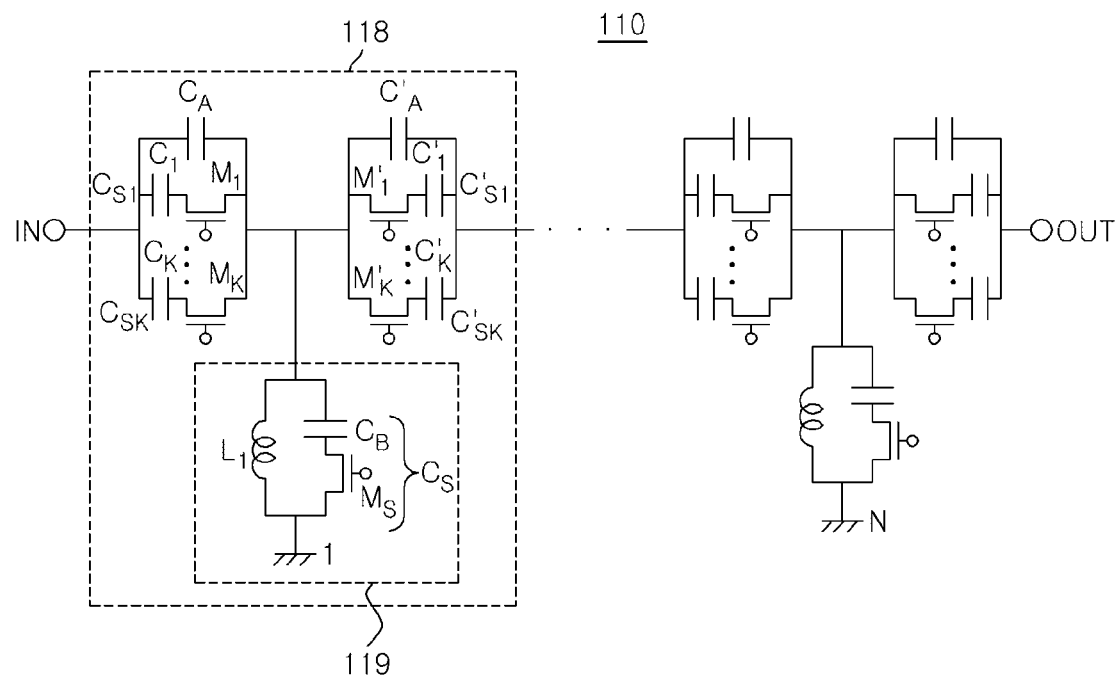
FIG. 8 is a circuit diagram of a delay compensation circuit in accordance with embodiment.

FIG. 8 is a circuit diagram of the delay compensation circuit in accordance with another embodiment.

A unit cell 118 of a delay compensation circuit 110 illustrated in FIG. 8 is the same as the unit cell 116 illustrated in FIG. 7 except that a switched capacitor $C_S$ is connected in parallel to the inductor $L_1$ illustrated in FIG. 7. The switched capacitor $C_S$ has a structure in which a switch $M_S$ and a capacitor $C_B$ are connected in series. The structure in which the switched capacitor $C_S$ is connected in parallel to the inductor $L_1$ is referred to as an inductor unit 119. Depending on ON and OFF of the switch $M_S$, an equivalent inductance of the inductor unit may vary. Thus, an operating frequency of the unit cell may also be reconfigured and a multi-band of a time delay circuit may be achieved.

A scale of the delay compensation circuits 110 illustrated in FIGS. 5 to 8 may be greatly reduced as compared to a case in which a conventional transmission line is used, and integration capability of the circuit may be improved.

Figure 9:
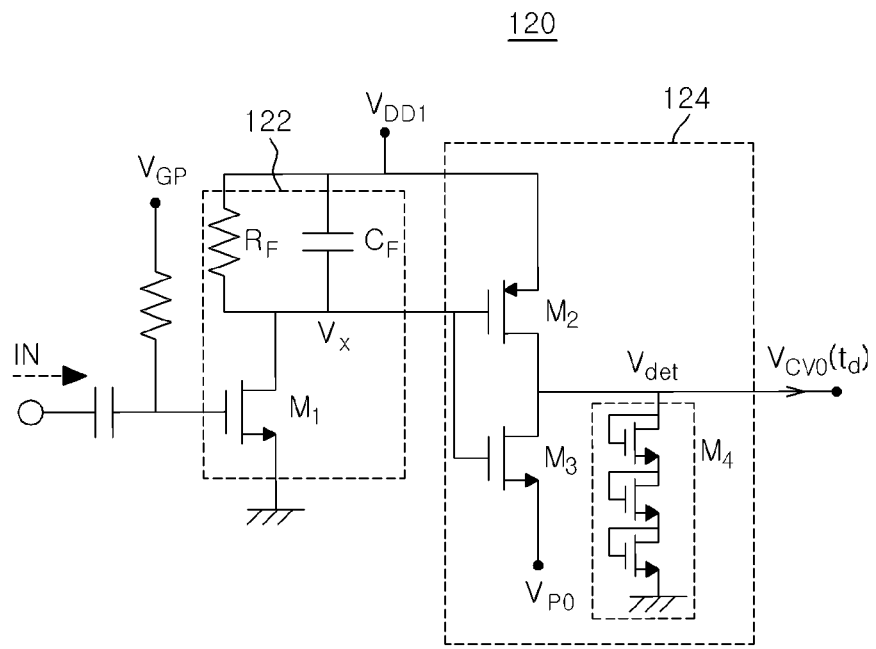
FIG. 9 is a circuit diagram of an envelope reshaping circuit in accordance with a representative embodiment.

FIG. 9 is a circuit diagram of the envelope reshaping circuit in accordance with a representative embodiment.

Referring to FIG. 9, the envelope reshaping circuit 120 is configured to output an envelope reshaping signal $V_{CV0}(t_d)$ based on an input signal. The envelope reshaping circuit 120 comprises an envelope detector 122 configured to generate an envelope signal from the input signal, and an envelope shaper 124 configured to generate the envelope reshaping signal $V_{CV0}(t_d)$ based on the generated envelope signal.

Referring to FIG. 9, the envelope detector 122 comprises a common-source FET $M_1$, a capacitor $C_F$, and a resistor $R_F$. A gate of the common-source FET $M_1$ is connected to the input terminal IN of the linearizer 100. The capacitor $C_F$ and the resistor $R_F$ are connected in parallel. One terminal of the capacitor $C_F$ and one terminal of the resistor $R_F$ are connected to a DC voltage source that supplies a voltage $V_{DD1}$, and the other terminal of the capacitor $C_F$ and the other terminal of the resistor $R_F$ are connected to a drain of the common-source FET $M_1$. The envelope shaper 124 comprises two FETs $M_2$ and $M_3$, and a diode-connected FET $M_4$. A drain of the FET $M_2$ and a drain of the FET $M_3$ are connected to a cathode of the varactor $C_V$ of FIG. 10. Further, a drain of the common-source FET $M_1$ is connected to a gate of the FET $M_3$ and a gate of the FET $M_2$.

Figure 10:
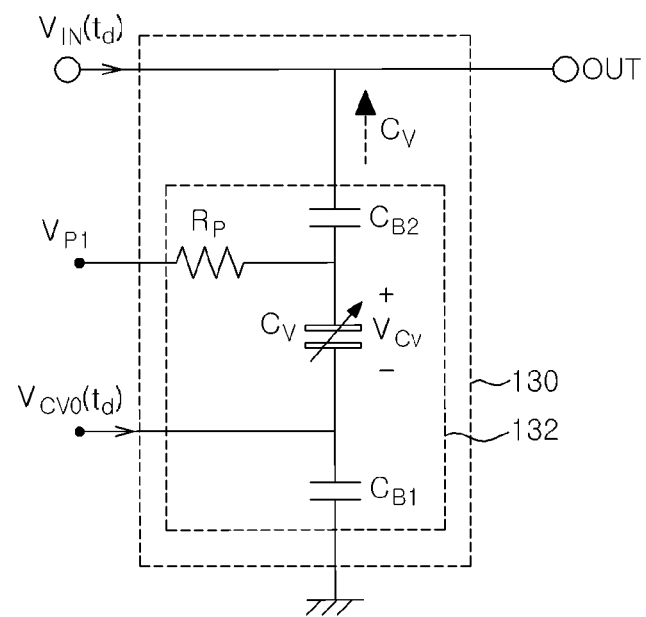
FIG. 10 illustrates a circuit diagram of a phase shift unit in accordance with a representative embodiment.

FIG. 10 illustrates a circuit diagram of the phase shift unit in accordance with the embodiment.

Referring to FIG. 10, the phase shift unit 130 comprises a varactor unit 132. For example, the varactor unit 132 comprises a varactor $C_V$ and capacitors $C_{B1}$ and $C_{B2}$. The capacitors $C_{B1}$ and $C_{B2}$ are connected to a cathode and an anode of the varactor $C_V$, respectively, and may block a DC component. The capacitors $C_{B1}$ and $C_{B2}$ may be omitted. The cathode of the varactor $C_V$ may be connected to a ground via the capacitor $C_{B1}$, and the anode of the varactor $C_V$ may be connected to the output terminal of the linearizer 100 via the capacitor $C_{B2}$. A DC voltage $V_{P1}$ may be connected to the anode of the varactor $C_V$ via a resistor $R_P$ for a DC bias. The resistor $R_P$ may have a value of several kilo ohms.

Referring back to FIG. 9, the envelope of the signal inputted to the input terminal of the linearizer 100 is detected by the envelope detector 122. The capacitor $C_F$ and the resistor $R_F$ of the envelope detector 122 filter the radio frequency signal inputted to the input terminal of the linearizer 100, and the common-source FET $M_1$ generates an envelope signal in an out-of-phase based on the filtered signal. The FET $M_2$ and the FET $M_3$ of the envelope shaper 124 may modify the envelope signal to generate an envelope reshaping signal $V_{CV0}(t_d)$. The envelope reshaping signal $V_{CV0}(t_d)$ is output from the drains of the FET $M_2$ and the FET $M_3$ to the cathode of the varactor $C_V$.

When the magnitude of the envelope signal is equal to or lower than a predetermined level, the envelope reshaping signal $V_{CV0}(t_d)$ is transferred to the cathode of the varactor $C_V$ without any change. Therefore, the varactor $C_V$ is positively biased. That is, a voltage $V_{CV}$ across the varactor $C_V$ is maintained at a value of a difference between the DC voltage $V_{P1}$ and the DC voltage $V_{p0}$ illustrated in FIG. 9. In this case, the capacitance of the varactor $C_V$ is maintained at a predetermined value.

When the magnitude of the envelope signal increases and exceeds the predetermined level (that is, when the magnitude reaches the vicinity of a maximum linear output power band), the envelope reshaping signal $V_{CV0}(t_d)$ is transferred to the cathode of the varactor $C_V$, as illustrated in FIGS. 2 to 4. As a result, the voltage $V_{CV}$ across the varactor $C_V$ decreases, and the capacitance of the varactor $C_V$ becomes smaller than the predetermined value.

Thus, the phase shift unit 130 adjusts the capacitance of the varactor $C_V$ based on the envelope reshaping signal $V_{CV0}(t_d)$ thereby outputting the envelope reshaped capacitance $C_V$. Accordingly, the AM-AM distortion and the AM-PM distortion of the amplifier connected to the output terminal may be compensated for.

The envelope shaper 124 may further comprise a limiter $M_4$ connected to the drain of the FET $M_2$ and the drain of the FET $M_3$. The limiter $M_4$ may limit a maximum negative power swing of the voltage $V_{CV}$ across the varactor $C_V$. In order to optimize the capacitance injection at target output power, reference capacitance of the varactor $C_V$ and the constant voltages $V_{p0}$ and $V_{p1}$ may be set to appropriate values. When a difference between the constant voltage $V_{p0}$ and the constant voltage $V_{p1}$ is reduced, a power level for starting the operation of the envelope reshaping circuit 120 is lowered.

Figure 11:
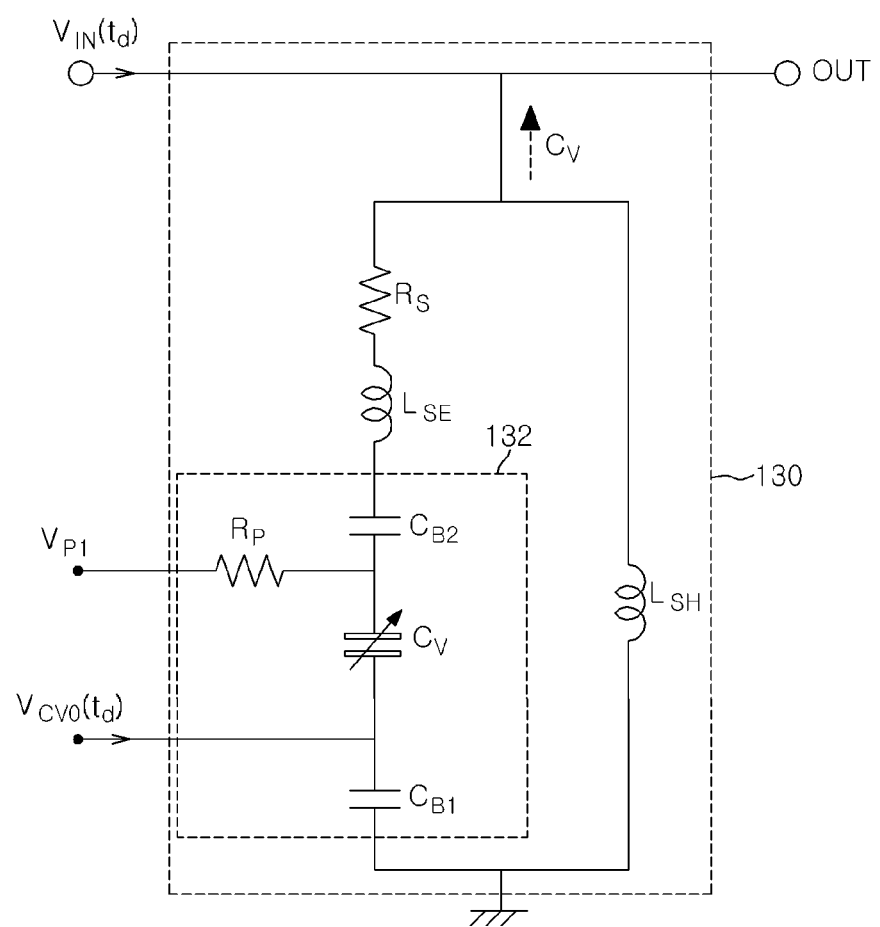
FIG. 11 illustrates a circuit diagram of a phase shift unit in accordance with embodiment.

FIG. 11 illustrates a circuit diagram of a phase shift unit in accordance with another embodiment.

Referring to FIG. 11, the phase shift unit 130 comprises a varactor unit 132, an inductor $L_{SE}$, a resistor $R_S$, and an inductor $L_{SH}$. Since a configuration of the varactor unit 132 is substantially the same as that of the varactor unit 132 illustrated in FIG. 10, a detailed description will be omitted. The varactor unit 132, the inductor $L_{SE}$, and the resistor $R_S$ are connected in series, and the inductor $L_{SH}$ is connected in parallel to the series circuit of the varactor unit 132, the inductor $L_{SE}$, and the resistor $R_S$. Since the inductor $L_{SE}$ reduces reactance of the varactor unit 132, a capacitance of the series circuit of the varactor unit 132, the inductor $L_{SE}$, and the resistor $R_S$ may be greater than that of the varactor $C_V$ in FIG. 9. Accordingly, a maximum value of the capacitance of the series circuit of the varactor unit 132, the inductor $L_{SE}$, and the resistor $R_S$ may increase to be slightly greater than a value of $C_{VH2}$, as illustrated in FIG. 4. The maximum value and a minimum value of the capacitance of the series circuit of the varactor unit 132, the inductor $L_{SE}$, and the resistor $R_S$ may decrease under the influence of the inductor $L_{SH}$. Accordingly, the maximum value and the minimum value of the capacitance of the series circuit of the varactor unit 132, the inductor $L_{SE}$, and the resistor $R_S$ may become to $C_{VH2}$ and $C_{VL2}$, respectively, as illustrated in FIG. 4. Thus, the ratio between $C_{VH2}$ and $C_{VL2}$ in FIG. 4 can be maximized, compared to the result of $C_{VH}$ and $C_{VL}$ in FIG. 4. This makes the circuit to have more AM-AM and AM-PM pre-distortions. When the resistor $R_S$ is inserted, loss may occur in the maximum value and the minimum value of the capacitance. Under the influence of the resistance $R_S$, the loss of the maximum value $C_{VH2}$ of the capacitance may be greater than the loss of the minimum value $C_{VL2}$ of the capacitance. Since the loss varies according to the value of the capacitance, the loss occurs depending on the envelope, and the AM-AM distortion may be enhanced. Accordingly, the AM-AM distortion and the AM-PM distortion of the amplifier connected to the output terminal may be greatly compensated for as compared to the case in which the single varactor in FIG. 10 is used.

Figure 12:
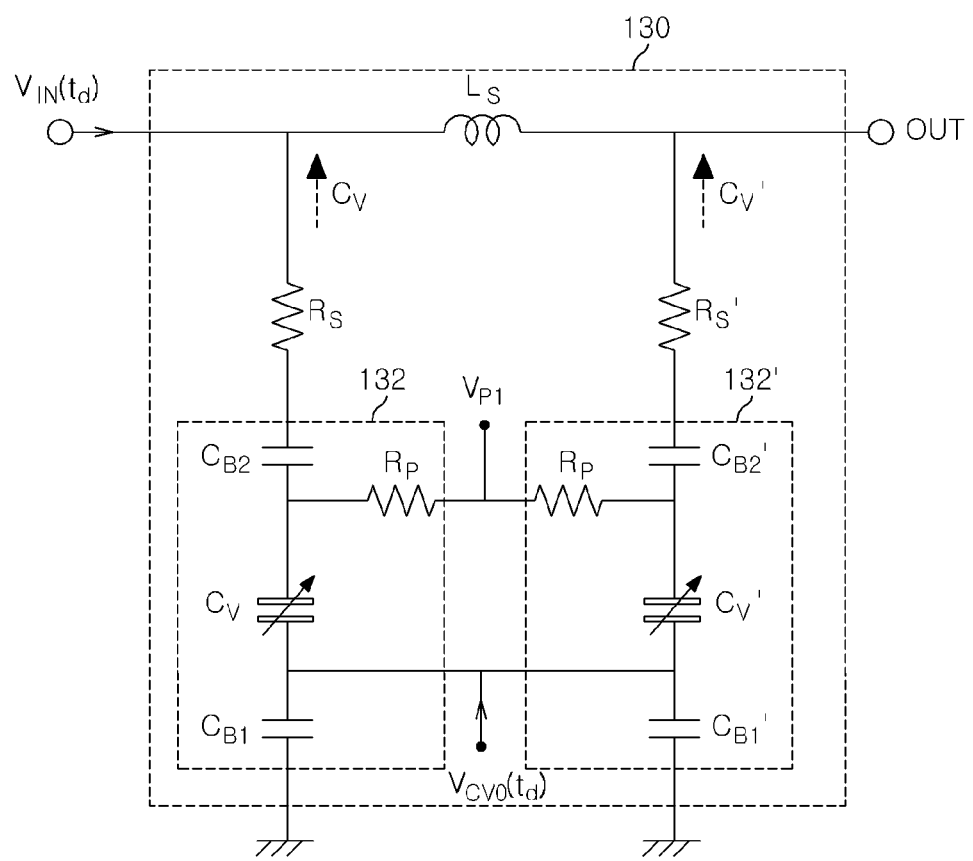
FIG. 12 illustrates a circuit diagram of a phase shift unit in accordance with embodiment.

FIG. 12 illustrates a circuit diagram of a phase shift unit in accordance with still another embodiment.

Referring to FIG. 12, a phase shift unit 130 may comprise first and second varactor units 132 and 132', an inductor $L_S$, and first and second resistors $R_S$ and $R_S'$. Since a configuration of the first and second varactor units 132 and 132' is substantially the same as that of the varactor unit 132 illustrated in FIG. 10, a detailed description thereof will be omitted. One terminal of the first resistor $R_S$ is connected to one terminal of the inductor $L_S$, and one terminal of the second resistor $R_S'$ is connected to the other terminal of the inductor $L_S$. One terminal of the first varactor unit 132 is connected to the other terminal of the first resistor $R_S$. One terminal of the second varactor unit 132' is connected to the other terminal of the second resistance $R_S'$. The other terminal of the first varactor unit 132 is grounded. The other terminal of the second varactor unit 132' is grounded. An anode of a varactor $C_V$ of the first varactor unit 132 is connected to an anode of a varactor $C_V'$ of the second varactor unit 132'. A cathode of the varactor $C_V$ of the first varactor unit 132 is connected to a cathode of the varactor $C_V'$ of the second varactor unit 132'.

While the phase shift unit 130 illustrated in FIG. 12 has a configuration in which the respective varactor units are connected to both terminals of one inductor, the phase shift unit 130 illustrated in FIG. 12 may have a configuration in which two or more inductors are connected in series, and varactor units are connected to terminals of the inductors, respectively. That is, the phase shift unit 130 may comprise three or more varactor units. Further, two or more phase shift units as illustrated in FIG. 12 may be connected and used, thus achieving more compensation on AM-AM and AM-PM.

Figure 13:
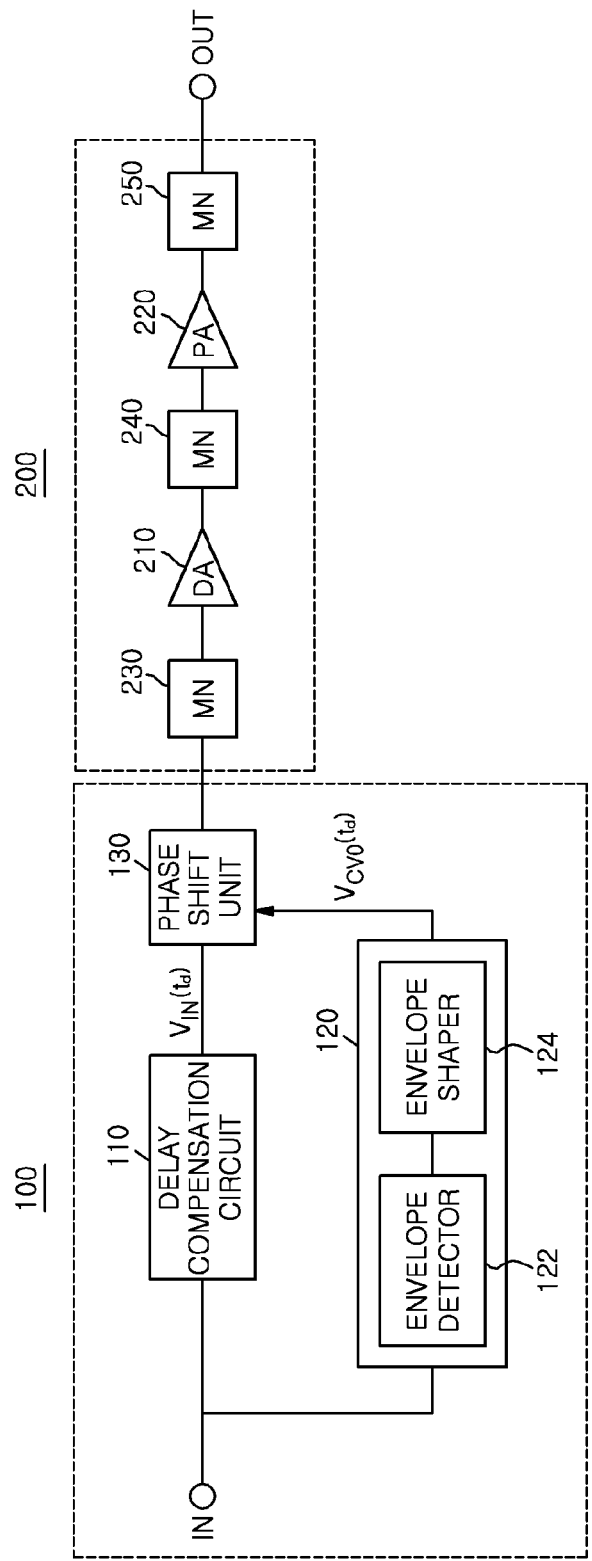
FIG. 13 illustrates a power amplifier in accordance with a representative embodiment.

FIG. 13 illustrates a power amplifier in accordance with a representative embodiment.

Referring to FIG. 13, the power amplifier comprises a power amplifier 200 and a linearizer 100. The linearizer 100 may be referred as a linearizing stage, and the power amplifier 200 may be referred as a power amplifying stage. Further, a communication apparatus, e.g., a mobile device, may comprise integrated circuitry comprising the power amplifier comprising the linearizing stage 100 and the power amplifier stage 200. The integrated circuitry may further comprise a processor, a memory, etc.

Since the linearizing stage 100 is substantially same as the linearizer 100 illustrated in FIG. 1, a detailed description thereof will be omitted.

The power amplifier stage 200 comprises a first amplification stage 210 and a second amplification stage 220. Impedance matching circuits 230, 240, and 250 are comprised on an input terminal side of the first amplification stage 210, an input terminal side of the second amplification stage 220, and an output terminal side of the second amplification stage 220, respectively.

An input signal, such as an output signal of the linearizer 100, is supplied to the input terminal of the first amplification stage 210 via the impedance matching circuit 230. The first amplification stage 210 pre-amplifies the output signal at a predetermined ratio, and outputs a pre-amplified signal. The pre-amplified signal from the first amplification stage 210 is provided to the input terminal of the second amplification stage 220 to drive the second amplification stage 220. Accordingly, the first amplification stage 210 and an output signal thereof, that is, the pre-amplified signal are referred to as a driver amplifier and a driving signal, respectively.

The pre-amplified signal is inputted to the second amplification stage 220 via the impedance matching circuit 240. The second amplification stage 220 amplifies the pre-amplified signal at a predetermined ratio, and outputs an amplified output signal. The amplified output signal is output as an output signal via the impedance matching circuit 250.

In view of this disclosure, it is to be noted that the protection circuit may be implemented in a variety of elements and variant structures. Further, the various elements, structures and parameters are included for purposes of illustrative explanation only and not in any limiting sense. In view of this disclosure, those skilled in the art may be able to implement the present teachings in determining their own applications and needed elements and equipment to implement these applications, while remaining within the scope of the appended claims.

What is claimed is:

1. A linearizer comprising:
a delay compensation circuit configured to delay an input signal and to output the delayed input signal to a power amplifier;
an envelope reshaping circuit configured to detect an envelope of the input signal and to generate a reshaped envelope signal; and
a phase shift unit configured to provide an envelope reshaped capacitance based on the reshaped envelope signal to the delayed input signal to reshape the delayed input signal.

2. The linearizer of claim 1,
wherein the phase shift unit comprises a varactor unit comprising a varactor having a cathode connected to RF-ground and an anode connected to the power amplifier,
wherein the reshaped envelope signal is inputted to the cathode of the varactor, and
the phase shift unit is configured to adjust a capacitance of the varactor to provide the envelope reshaped capacitance to the delayed input signal.

3. The linearizer of claim 1,
wherein the phase shift unit comprises a first inductor, a second inductor and a resistor and a varactor unit comprising a varactor,
wherein one terminal of the varactor is connected to RF-ground, and the reshaped envelope signal is inputted to the one terminal,
the second inductor, the resistor and the varactor unit are connected in series to form a series circuit, and
the first inductor and the series circuit of the second inductor, the resistor and the varactor unit are connected in parallel.

4. The linearizer of claim 1,
wherein the phase shift unit comprises an inductor, a first varactor unit comprising a first varactor and a second varactor unit comprising a second varactor,
wherein one terminal of the first varactor unit is connected to RF-ground, another terminal of the first varactor unit is connected to one terminal of the inductor, one terminal of the second varactor unit is connected to ground, another terminal of the second varactor unit is connected to another terminal of the inductor, and the one terminal of the first varactor unit is connected to the one terminal of the second varactor unit, and
the reshaped envelope signal is inputted to the one terminal of the first varactor unit and the one terminal of the second varactor unit, respectively.

5. The linearizer of claim 1,
wherein the delay compensation circuit comprises one or more delay circuits, and
each of said one or more delay circuits comprises a first resistor, a second resistor, a first varactor, a second varactor, and an inductor,
wherein a cathode of the first varactor is connected to a cathode of the second varactor, one terminal of the inductor is connected between the cathode of the first varactor and the cathode of the second varactor, another terminal of the inductor is grounded, an anode of the first varactor is connected to one terminal of the first resistor, an anode of the second varactor is connected to one terminal of the second resistor, and another terminal of the first resistor is connected to another terminal of the second resistor.

6. The linearizer of claim 5,
wherein the delay compensation circuit further comprises a first capacitor and a second capacitor,
wherein the first capacitor is connected in parallel to the first varactor, and the second capacitor is connected in parallel to the second varactor.

7. The linearizer of claim 1,
wherein the delay compensation circuit comprises one or more delay circuits, and
each of said one or more delay circuits comprises an inductor, and two capacitor units connected in series,
each of the two capacitor units comprises a capacitor and one or more switched capacitors, the capacitor being connected in parallel to said one or more switched capacitors,
wherein one terminal of the inductor is connected between the two capacitor units, and another terminal of the inductor is grounded.

8. The linearizer of claim 7,
wherein each of said one or more delay circuits further comprises an additional switched capacitor connected in parallel to the inductor.

9. A power amplifier comprising:
a linearizing stage comprising a delay compensation circuit configured to delay an input signal and to output the delayed input signal, an envelope reshaping circuit configured to detect an envelope of the input signal and to generate a reshaped envelope signal, and a phase shift unit configured to provide an envelope reshaped capacitance based on the reshaped envelope signal to the delayed input signal to reshape the delayed input signal; and
a power amplifying stage comprising a first amplification stage having a first transistor configured to receive the delayed and reshaped input signal, to amplify the delayed and reshaped input signal and to output a amplified signal, and a second amplification stage having a second transistor configured to further amplify the amplified signal.

10. The power amplifier of claim 9,
wherein the phase shift unit comprises a varactor unit comprising a varactor having a cathode connected to RF-ground and an anode connected to the power amplifier,
wherein the reshaped envelope signal is inputted to the cathode of the varactor, and
the phase shift unit is configured to adjust a capacitance of the varactor to provide the envelope reshaped capacitance to the delayed input signal.

11. The power amplifier of claim 9,
wherein the phase shift unit comprises a first inductor, a second inductor and a resistor and a varactor unit comprising a varactor,
wherein one terminal of the varactor is connected to RF-ground, and the reshaped envelope signal is inputted to the one terminal,
the second inductor, the resistor and the varactor unit are connected in series to form a series circuit, and
the first inductor and the series circuit of the second inductor, the resistor and the varactor unit are connected in parallel.

12. The power amplifier of claim 9,
wherein the phase shift unit comprises an inductor, a first varactor unit comprising a first varactor and a second varactor unit comprising a second varactor,
wherein one terminal of the first varactor unit is connected to RF-ground, another terminal of the first varactor unit is connected to one terminal of the inductor, one terminal of the second varactor unit is connected to RF-ground, another terminal of the second varactor unit is connected to another terminal of the inductor, and the one terminal of the first varactor unit is connected to the one terminal of the second varactor unit, and
the reshaped envelope signal is inputted to the one terminal of the first varactor unit and the one terminal of the second varactor unit, respectively.

13. The power amplifier of claim 9,
wherein the delay compensation circuit comprises one or more delay circuits, and
each of said one or more delay circuits comprises a first resistor, a second resistor, a first varactor, a second varactor, and an inductor,
wherein a cathode of the first varactor is connected to a cathode of the second varactor, one terminal of the inductor is connected between the cathode of the first varactor and the cathode of the second varactor, another terminal of the inductor is grounded, an anode of the first varactor is connected to one terminal of the first resistor, an anode of the second varactor is connected to one terminal of the second resistor, and another terminal of the first resistor is connected to another terminal of the second resistor.

14. The power amplifier of claim 13,
wherein the delay compensation circuit further comprises a first capacitor and a second capacitor,
wherein the first capacitor is connected in parallel to the first varactor, and the second capacitor is connected in parallel to the second varactor.

15. The power amplifier of claim 9,
wherein the delay compensation circuit comprises one or more delay circuits, and each of said one or more delay circuits comprises an inductor, and two capacitor units connected in series,
each of the two capacitor units comprises a capacitor and one or more switched capacitors, the capacitor being connected in parallel to said one or more switched capacitors,
wherein one terminal of the inductor is connected between the two capacitor units, and another terminal of the inductor is grounded.

16. The power amplifier of claim 15,
wherein each of said one or more delay circuits further comprises an additional switched capacitor connected in parallel to the inductor.

17. Integrated circuitry comprising:
a linearizing stage comprising a delay compensation circuit configured to delay an input signal and to output the delayed input signal, an envelope reshaping circuit configured to detect an envelope of the input signal and to generate a reshaped envelope signal, and a phase shift unit comprising a varactor unit comprising a varactor, the phase shift unit configured to adjust a capacitance of the varactor based on the reshaped envelope signal to provide an envelope reshaped capacitance to the delayed input signal and to generate a delayed and reshaped input signal; and
a power amplifying stage comprising a first amplification stage having a first transistor configured to receive the delayed and reshaped input signal, to amplify the delayed and reshaped input signal and to output a amplified signal, and a second amplification stage having a second transistor configured to further amplify the amplified signal.

18. The integrated circuitry of claim 17,
wherein the phase shift unit further comprises a first inductor, a second inductor and a resistor,
wherein one terminal of the varactor is connected to RF-ground, and the reshaped envelope signal is inputted to the one terminal,
the second inductor, the resistor and the varactor unit are connected in series to form a series circuit, and
the first inductor and the series circuit of the second inductor, the resistor and the varactor unit are connected in parallel.

19. The integrated circuitry of claim 17,
wherein the delay compensation circuit comprises one or more delay circuits, and
each of said one or more delay circuits comprises a first resistor, a second resistor, a first varactor, a second varactor, and an inductor,
wherein a cathode of the first varactor is connected to a cathode of the second varactor, one terminal of the inductor is connected between the cathode of the first varactor and the cathode of the second varactor, another terminal of the inductor is grounded, an anode of the first varactor is connected to one terminal of the first resistor, an anode of the second varactor is connected to one terminal of the second resistor, and another terminal of the first resistor is connected to another terminal of the second resistor.

20. The integrated circuitry of claim 17,
wherein the delay compensation circuit comprises one or more delay circuits, and
each of said one or more delay circuits comprises an inductor, and two capacitor units connected in series, each of the two capacitor units comprises a capacitor and one or more switched capacitors, the capacitor being connected in parallel to said one or more switched capacitors, wherein one terminal of the inductor is connected between the two capacitor units, and another terminal of the inductor is grounded.

* * * * *